(12) United States Patent  (10) Patent No.: US 8,221,132 B2
Jeon et al.  (45) Date of Patent: Jul. 17, 2012

(54) ELECTRICAL CONNECTOR ASSEMBLY

(75) Inventors: Myoungsoo Jeon, Harrisburg, PA (US);
Attalee Snarr Taylor, Palmyra, PA
(US); John Joseph Consoli, Harrisburg,
PA (US)

(73) Assignee: Tyco Electronics Corporation, Berwyn,
PA (US)

( * ) Notice: Subject to any disclaimer, the term of this
patent is extended or adjusted under 35
U.S.C. 154(b) by 22 days.

(21) Appl. No.: 12/868,370

(22) Filed: Aug. 25, 2010

(65) Prior Publication Data

US 2012/0052695 A1 Mar. 1, 2012

(51) Int. Cl.
*H01R 12/00* (2006.01)
(52) U.S. Cl. .......................................... 439/55; 439/65
(58) Field of Classification Search .................. 174/255,
174/262–266; 361/792–795; 439/55, 65,
439/75, 82, 746–749, 751
See application file for complete search history.

(56) References Cited

U.S. PATENT DOCUMENTS

| | | | | |
|---|---|---|---|---|
| 2,006,813 A | * | 7/1935 | Powers | 411/352 |
| 3,571,923 A | * | 3/1971 | Shaheen et al. | 29/852 |
| 4,543,715 A | * | 10/1985 | Iadarola et al. | 29/852 |
| 4,658,104 A | * | 4/1987 | Koizumi et al. | 200/512 |
| 4,698,026 A | * | 10/1987 | Rolf | 439/82 |
| 5,199,879 A | * | 4/1993 | Kohn et al. | 439/63 |
| 5,823,830 A | * | 10/1998 | Wurster | 439/751 |
| 6,593,535 B2 | * | 7/2003 | Gailus | 174/262 |
| 7,074,094 B2 | * | 7/2006 | Kawahara et al. | 439/751 |
| 7,270,573 B2 | * | 9/2007 | Houtz | 439/607.39 |
| 7,377,823 B2 | * | 5/2008 | Chen | 439/751 |
| 7,491,897 B2 | | 2/2009 | Watanabe et al. | |
| 7,963,776 B1 | * | 6/2011 | Morgan | 439/75 |
| 2005/0093559 A1 | * | 5/2005 | Mori et al. | 324/761 |
| 2008/0207015 A1 | | 8/2008 | Sueyoshi | |

* cited by examiner

*Primary Examiner* — Thanh Tam Le

(57) ABSTRACT

An electrical connector assembly includes a circuit board and
an electrical connector mounted on the circuit board. The
circuit board has a circuit board body having first and second
surfaces and through-holes bored between the first and second surfaces. The circuit board has signal traces on internal
layers of the circuit board that are generally parallel to the first
and second surfaces. Portions of the circuit board body within
the through-holes are etched away to expose portions of the
signal traces beyond the circuit board body within the corresponding through-hole. The electrical connector includes a
housing and signal terminals held by the housing. The signal
terminals are received in respective through-holes of the circuit board and engage the corresponding signal traces.

20 Claims, 5 Drawing Sheets

ELECTRICAL CONNECTOR ASSEMBLY

BACKGROUND OF THE INVENTION

The subject matter herein relates generally to electrical connector assemblies, and more particularly, to circuit boards for electrical connector assemblies.

To meet digital multi-media demands, higher data throughput is often desired for current digital communications equipment. Electrical connectors that interconnect circuit boards must therefore handle ever increasing signal speeds at ever increasing signal densities. One application environment that uses such electrical connectors is in high speed, differential electrical connectors, such as those common in the telecommunications or computing environments. In a traditional approach, two circuit boards are interconnected with one another in a backplane and a daughter board configuration. However, at the footprints of the circuit boards where the electrical connectors connect thereto, it may be difficult to improve density while maintaining electrical performance and/or reasonable manufacturing cost. For example, in known circuit boards, vias within the circuit boards are plated, creating plated through-holes (PTHs) that are electrically connected to corresponding traces in the circuit board. A certain aspect ratio of the via diameter to the via length must be maintained for effective plating. Contacts extending from the electrical connectors are connected to the PTHs, and thus the traces, using eye-of-the-needle contacts.

Known electrical connectors having PTHs are not without disadvantages. For instance, the PTHs create electrical problems, such as low impedance and high cross-talk through the circuit board. One method of improving such footprints is to counterbore a portion(s) of the PTHs to remove the plating to an area just in the vicinity of the corresponding trace in the circuit board. However, the same problems still remain in the short length of the non-bored PTHs that remain for interfacing the contacts with the traces. Such region, though short, still has low impedance, which becomes increasingly problematic at higher transmission speeds.

To achieve higher system densities and speed, further improvement of circuit board footprints and connections to the circuit boards must be made over known approaches. There is a need for an electrical connector that enables improvement of the density and/or electrical performance of circuit board footprints to achieve higher system densities and/or higher system speeds.

BRIEF DESCRIPTION OF THE INVENTION

In one embodiment, a circuit board is provided that includes a circuit board body having first and second surfaces. The circuit board body has through-holes extending between the first and second surfaces that are defined by walls. The circuit board also includes signal traces within the circuit board body that are generally parallel to the first and second surfaces. The signal traces are exposed within corresponding through-holes and extend at least partially into the corresponding through-holes beyond the walls. The through-holes are configured to receive signal terminals of an electrical connector such that the signal terminals engage the corresponding signal traces.

In another embodiment, an electrical connector assembly is provided including a circuit board and an electrical connector mounted on the circuit board. The circuit board has a circuit board body having first and second surfaces and through-holes bored between the first and second surfaces. The circuit board has signal traces on internal layers of the circuit board that are generally parallel to the first and second surfaces. Portions of the circuit board body within the through-holes are etched away to expose portions of the signal traces beyond the circuit board body within the corresponding through-hole. The electrical connector includes a housing and signal terminals held by the housing. The signal terminals are received in respective through-holes of the circuit board and engage the corresponding signal traces.

In a further embodiment, an electrical connector assembly is provided including a circuit board and an electrical connector mounted on the circuit board. The circuit board has first and second surfaces and through-holes extending along axes between the first and second surfaces. The circuit board has signal traces within the circuit board that are generally parallel to the first and second surfaces and are exposed within corresponding through-holes. The electrical connector includes a housing and signal terminals held by the housing. The signal terminals have compliant pins received in respective through-holes of the circuit board. The compliant pins have compliant sections including opposite, parallel interface edges oriented parallel to the axes of the through-holes. The interface edges engage the corresponding signal traces.

DETAILED DESCRIPTION OF THE INVENTION

Figure 1:
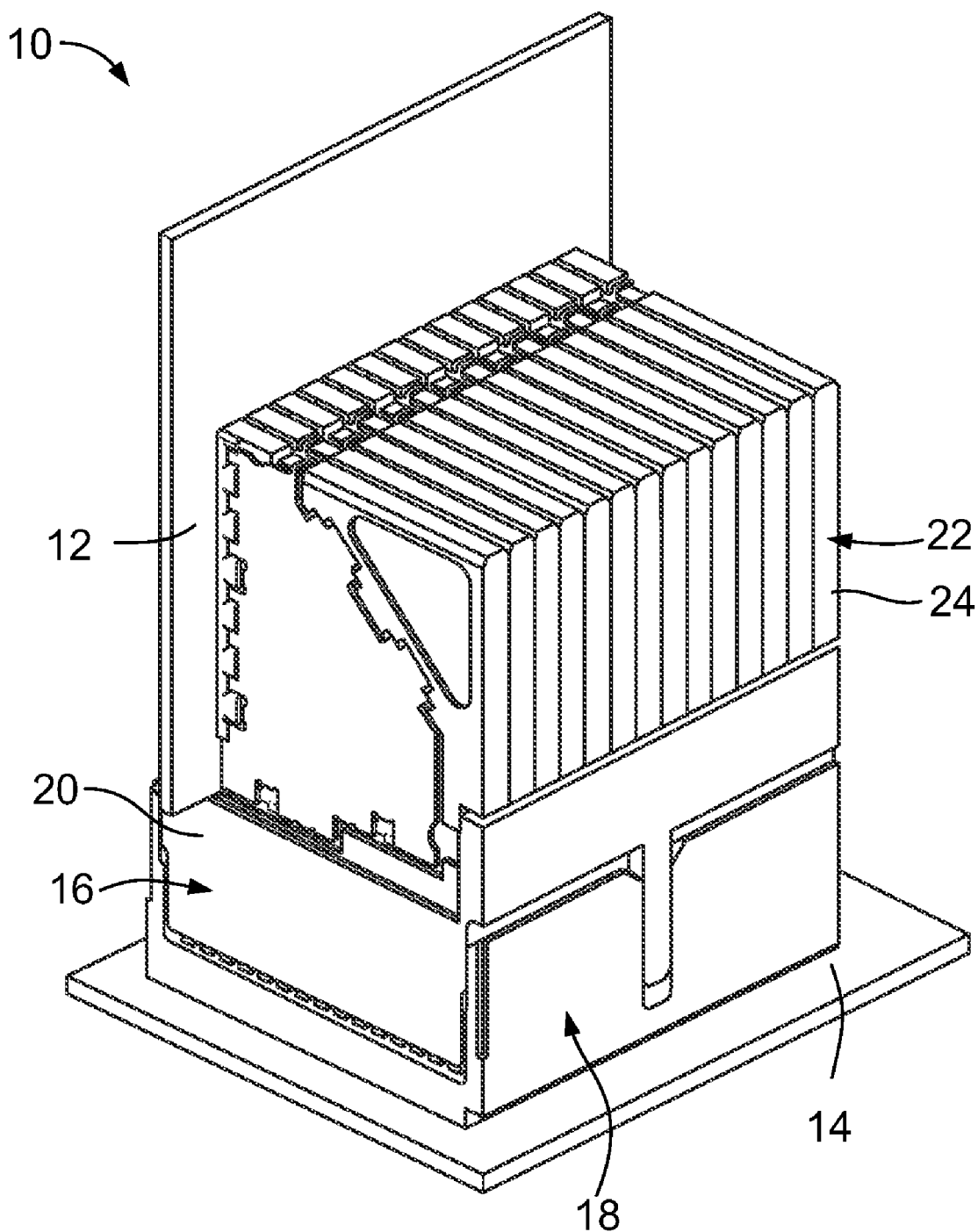
FIG. 1 illustrates an electrical connector assembly formed in accordance with an exemplary embodiment.

FIG. 1 illustrates an electrical connector assembly 10. The electrical connector assembly 10 includes a pair of circuit boards 12 and 14, a receptacle connector 16, and a header connector 18. The receptacle connector 16 is mounted on the circuit board 12, and the header connector 18 is mounted on the circuit board 14. The receptacle connector 16 and the header connector 18 are connected together to electrically connect the circuit boards 12 and 14.

In the exemplary embodiment of FIG. 1, the receptacle connector 16 and the header connector 18 are oriented such that the connectors 16 and 18 form an approximate right-angle connection between the circuit boards 12 and 14. Alternatively, the receptacle connector 16 and the header connector 18 may be oriented such that the circuit boards 12 and 14 are oriented at any other angle relative to each other, such as, but not limited to, approximately parallel.

The receptacle connector 16 includes a dielectric housing 20 that, in the illustrated embodiment, holds a plurality of parallel contact modules 22. Each contact module 22 includes a dielectric contact module housing 24 that holds a contact lead frame (not shown). The contact lead frame includes a plurality of signal terminals (not shown) and a plurality of ground terminals (not shown). The signal and ground terminals may be terminated to the circuit board 12 and are configured to be electrically connected to corresponding terminals of the header connector 18. Alternatively, rather than holding a contact lead frame, the contact module housing 24 may hold individual signal and ground terminals. The contact modules 22 may have other types of contacts, such as power contacts, in alternative embodiments.

Figure 2:
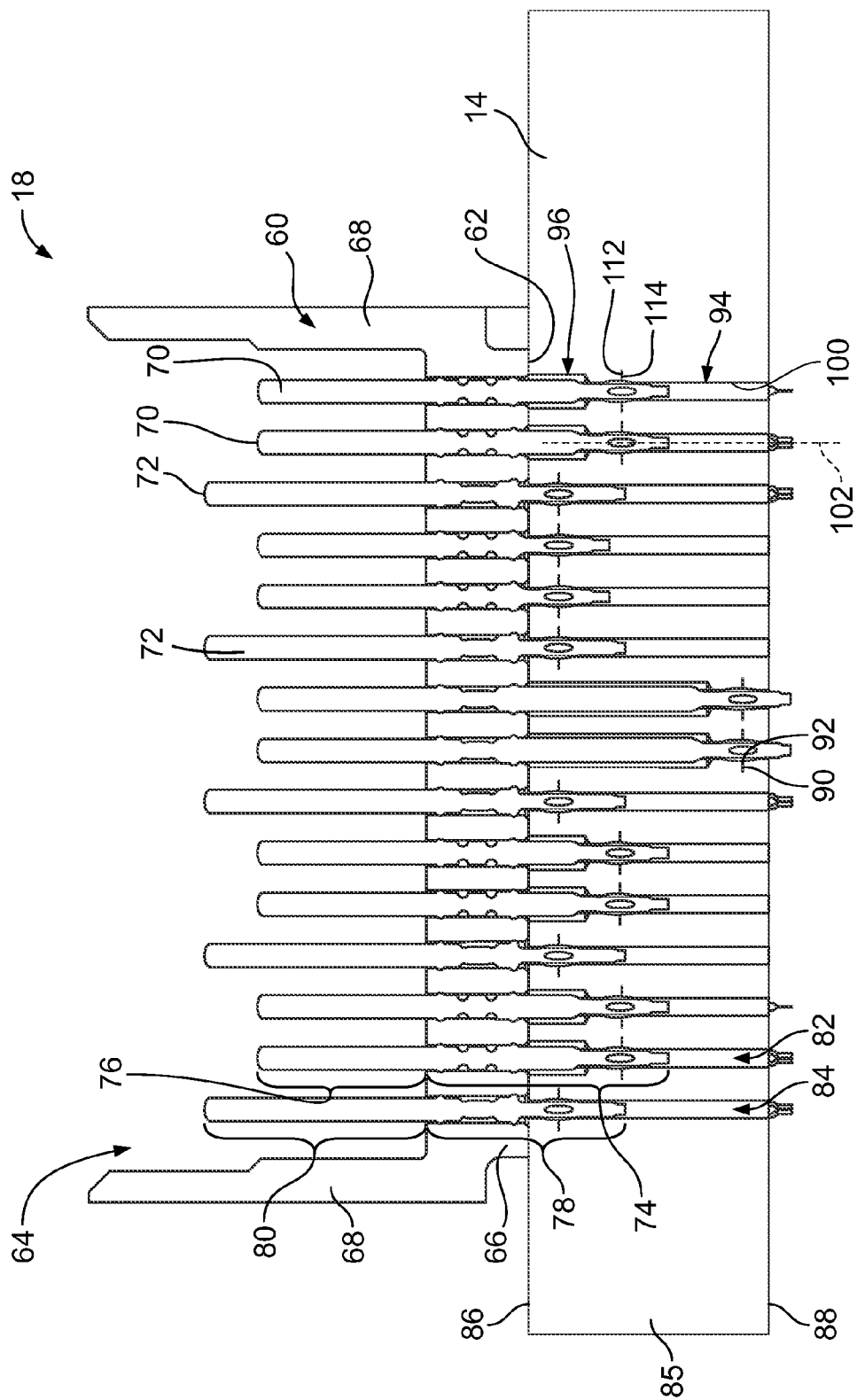
FIG. 2 is a cross-sectional view of the electrical connector assembly shown in FIG. 1.

FIG. 2 is a cross-sectional view of a portion of the electrical connector assembly, showing the header connector 18 mounted to the circuit board 14. The header connector 18 includes a dielectric housing 60 that receives the receptacle connector 16 (shown on FIG. 1). The housing 60 has a mounting surface 62 for mounting the header connector 18 to the circuit board 14. The housing 60 includes a chamber 64 that receives the receptacle connector 16 (shown in FIG. 1). The chamber 64 is defined by a base wall 66 and side walls 68 extending from the base wall 66.

The housing 60 holds a plurality of signal terminals 70 and a plurality of ground terminals 72. The signal terminals 70 are optionally arranged in differential pairs. The signal and ground terminals 70, 72 extend through the base wall 66 into the chamber 64. The base wall 66 is mounted to the circuit board 14.

Each signal terminal 70 includes a mounting contact 74 at one end portion of the signal terminal 70 and a mating contact 76 at an opposite end portion of the signal terminal 70. Similarly, each ground terminal 72 includes a mounting contact 78 at one end portion of the ground terminal 72 and a mating contact 80 at an opposite end portion of the ground terminal 72. The mating contacts 76, 80 are arranged within the chamber 64 for mating engagement with signal and ground terminals, (not shown) of the receptacle connector 16.

The mounting contacts 74 are received within a corresponding signal through-hole 82 of the circuit board 14. Optionally, some of the mounting contacts 74 of the signal terminals 70 extend different lengths from the mounting surface 62 of the header connector 18 than others of the mounting contacts 74. The mounting contacts 78 are received within a corresponding ground through-hole 84 of the circuit board 14.

The circuit board 14 includes a circuit board body 85 extending between first and second surfaces 86, 88. The signal through-holes 82 extend through the circuit board body 85 between the first and second surfaces 86, 88. The signal through-holes 82 extend through, and expose a corresponding signal trace 90 arranged on one of the layers of the circuit board 14. The thickness of the circuit board 14 is a function of the number of layers, and the number of layers may depend, at least in part, on the number of components being connected to the circuit board 14. For example, a backplane circuit board may be substantially thicker than a daughtercard circuit board because many more electrical components are connected to the backplane circuit board as compared to the daughtercard circuit board, thus more layers are required to route the traces through the board.

In an exemplary embodiment, the signal through-holes 82 are not plated, and thus have a smaller diameter as compared to plated through-holes, which must maintain a certain aspect ratio between the diameter and the thickness of the board for effective plating. Because the signal through-holes 82 can have a smaller diameter as compared to plated through-holes, the signal through-holes 82 can be spaced closer together, increasing the density of the circuit board 14. Additionally, because the signal through-holes 82 are not plated, the signal through-holes 82 do not include any areas of low impedance as is common of plated through-holes.

The signal trace 90 is arranged generally parallel to the first and second surfaces 86, 88. The signal trace 90 may be deposited on one of the layers forming the circuit board body 85. The signal trace 90 is arranged at a depth from the first surface 86, such that the signal trace 90 is internal to the circuit board, as opposed to being a surface mounting pad on the first surface 86. The signal trace 90 is provided in, or on, a particular layer of the circuit board 14. Optionally, the signal trace 90 may be routed to different layers of the circuit board 14 remote from the location of the corresponding signal through-hole 82. The signal traces 90 of some of the signal through-holes 82 are located at different depths from the first surface 86 of the circuit board 14 than the signal traces 90 of others of the signal through-holes 82.

Optionally, an outer perimeter of the signal trace 90 may be circular in shape with the signal through-hole 82 extending through the middle, thus defining a ring shaped capture pad, such as at an end of the signal trace 90. A planar, linear trace element may be routed along one or more of the layers of the circuit board 14 from the donut shaped pad to other portions of the circuit board 14. The signal trace 90 is at least partially exposed within the signal through-hole 82. For example, the signal trace 90 may be exposed by a boring process exposing an inner edge 92 of the signal trace 90. The signal trace 90 may be exposed by an etching process exposing a top, bottom and/or internal sides of the signal trace 90. For example, the etching process may remove some of the circuit board body 85 along the signal through-hole 82 above and below the signal trace 90, such that the top and bottom of the signal trace 90 are exposed within the signal through-hole 82.

Some of the signal through-holes 82 may be staged along a length thereof to include a smaller diameter portion 94 and one or more larger diameter portions 96. The smaller diameter portion 94 constitutes a constricted region. The smaller diameter portion 94 is provided proximate to the signal trace 90. The larger diameter portion 96 is arranged above the constricted region, and may be referred to as an upper larger diameter portion or an upper through-hole. Optionally, another larger diameter portion may also be arranged below the constricted region, and may be referred to as a lower larger diameter portion or a lower through-hole. Each signal through-hole 82 includes a wall 100 defining the signal through-hole 82. The wall 100 is stepped outward to define the larger diameter portion 96. The larger diameter portion(s) 96 are formed by counterboring a portion of the signal through-hole 82 to remove material from one or more layers of the circuit board body 85.

The increased diameter of the larger diameter portion 96 introduces air in the signal through-hole 82 along an axis 102 of the signal through-hole 82. The air affects interpair and intrapair coupling, such as by lowering cross-talk with neighboring signal traces 90 and/or raising impedance of the signal terminals 70. In an exemplary embodiment, the larger diameter portions 96 are filled with air, which has a dielectric constant of approximately 1.0, as opposed to the material of the circuit board body 85, which may be FR-4 having a dielectric constant of approximately 4.3. The air surrounding the signal terminals 70 affects the electrical characteristics of the signal terminals 70, such as by affecting the interactions between the adjacent signal terminals 70 and/or by affecting the interactions between the signal terminals 70 and the neighboring signal traces 90.

The larger diameter portion 96 also provides spacing between the signal terminal 70 and the corresponding wall 100, such that the signal terminal 70 does not engage the wall 100 in the larger diameter portion 96. The signal terminals 70 may be easier to insert into the signal through-hole 82 because the signal terminal 70 does not rub against the wall 100, which may reduce contact wear and/or reduce the occurrence of buckling or other damage to the signal terminal 70.

Figure 3:
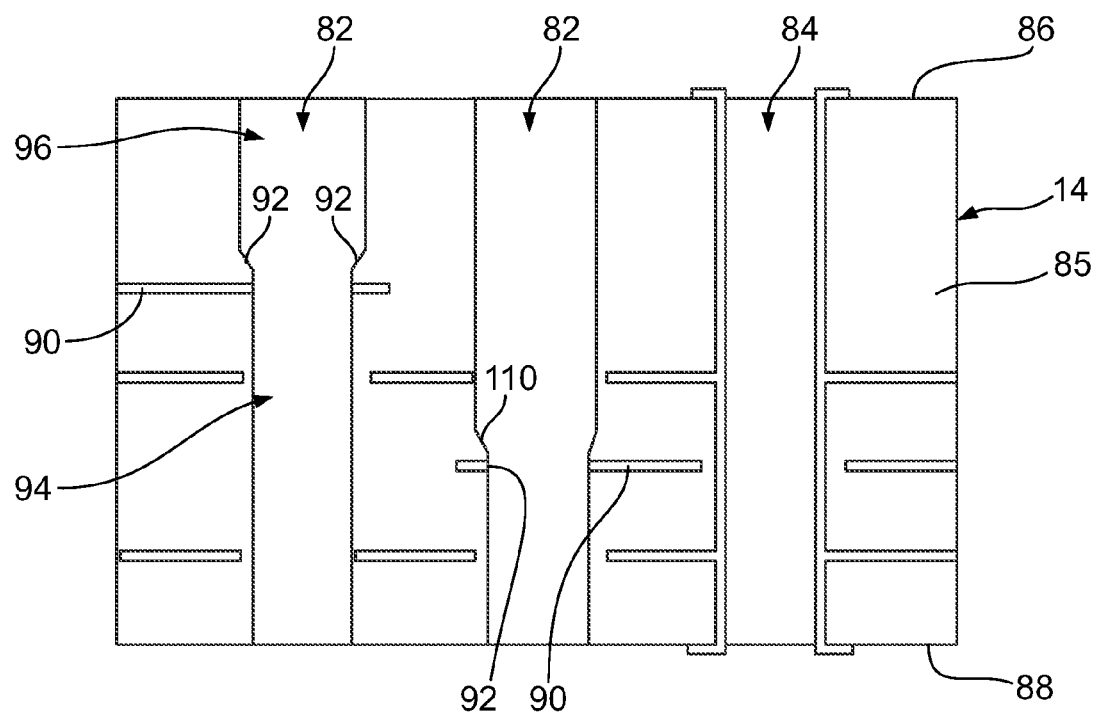
FIG. 3 illustrates a portion of a circuit board for the electrical connector assembly shown in FIG. 2 during one stage of manufacture.

FIG. 3 illustrates a portion of the circuit board 14 during one stage of manufacture, such as after a boring process. The circuit board 14 is manufactured by a laminating process, wherein various layers are deposited to form the circuit board body 85. The signal traces 90 are deposited on specific layers and arranged parallel to the first and second surfaces 86, 88.

In an exemplary embodiment, the ground through-holes 84 are formed by forming an opening within the circuit board 14, such as during an initial boring process. The ground through-holes 84 are than plated. The plating material is electrically connected to one or more ground layers of the circuit board 14.

After the ground through-holes 84 are bored and plated, the signal through-holes 82 are formed by forming an opening within the circuit board 14, such as during a boring process. The boring process bores through the corresponding signal trace 90 to expose the inner edge 92 of the signal trace 90. In an exemplary embodiment, the signal through-holes 82 are not plated. Thereafter, the larger diameter portions 96 are formed from the first surface 86 down to the vicinity of the signal traces 90, such as during a counterboring process. The counterboring operation removes a portion of the circuit board body 85 to the counterbored depth. The counterboring process defines an upper shoulder 110 between the smaller diameter portion 94 and the upper larger diameter portion 96 at a top of the smaller diameter portion 94. Optionally, a lower larger diameter portion may be formed in a similar manner as the upper larger diameter portion 96 by a similar counterboring process.

Figure 4:
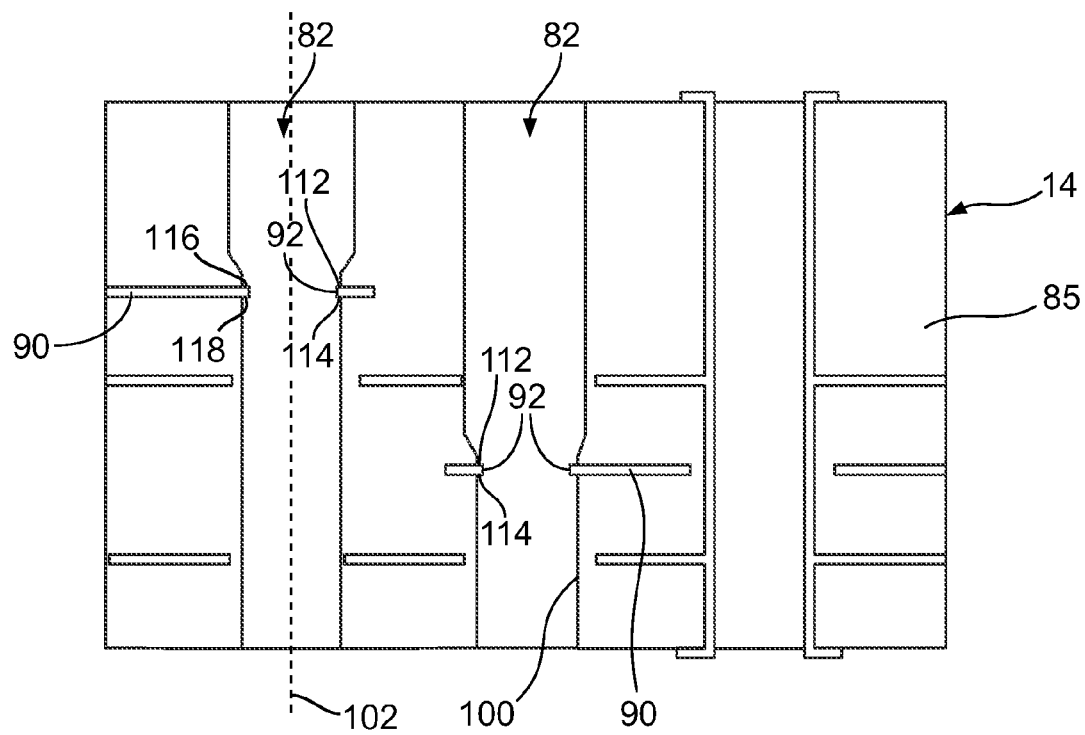
FIG. 4 illustrates the circuit board during another stage of manufacture.

FIG. 4 illustrates a portion of the circuit board 14 during another stage of manufacture, such as after an etching process. After the signal through-hole 82 is bored, the wall 100 is partially etched away to expose portions of the signal trace 90. For example, the signal through-hole 82 may be plasma etched or chemically etched to remove a thin layer of the wall 100 along the length of the axis 102.

When etched, the diameter of the signal through-hole 82 is increased. For example, the etching removes the epoxy and glass fibers of the circuit board body 85 leaving the copper signal trace 90 protruding into the signal through-hole 82. Only the circuit board body 85 is etched away, while the signal trace 90 remains, and is not removed by the etching process. A greater amount of the signal trace 90 is exposed after the etching process than before the etching process. For example, in addition to the inner edge 92 being exposed within the signal through-hole 82, an upper surface 112 and a lower surface 114 may also be exposed within the signal through-hole 82. The upper and lower surfaces 112, 114 define upper and lower ledges 116, 118 extending radially inward from the wall 100. The exposed portion of the signal trace 90 may be ring-shaped defining an annular ledge extending radially inward from the wall 100 with a radially inner surface defining the inner edge 92. The inner edge 92 may be a circumferential edge having a first diameter that is less than a diameter of the signal through-hole 82 adjacent the signal trace 90. Optionally, the signal trace 90 may be desmeared during the etching process to remove impurities from the exposed portion of the signal trace 90, allowing the signal trace 90 to be a more conductive interface.

The amount of the upper and lower surfaces 112, 114 exposed may depend on the amount of circuit board material removed by the etching process. For example, between approximately 0.001" and 0.003" of circuit board material may be removed by the etching process. Alternatively, more or less material may be removed in alternative embodiments. Optionally, the exposed surface area of the signal trace 90 after the etching process may be at least twice the exposed surface area prior to the etching process.

Returning to FIG. 2, when the header connector 18 is mounted on the circuit board 14, the signal terminals 70 are each received within the corresponding signal through-holes 82, such that the mating end 74 of the signal terminals 70 are electrically connected to the respective signal traces 90. The signal traces 90 are directly engaged by the signal terminals 70, as opposed to having plating material that is electrically connected to the signal traces 90. As the signal terminals 70 are loaded into the signal through-holes 82, the signal terminals 70 engage the upper surfaces 112, inner edges 92 and/or lower surfaces 114. A greater surface area of the signal traces 90 engage the signal terminals 70, which makes more reliable electrical connections than if the signal terminals 70 were jug to engage the inner edges 92, such as if the walls 100 had not been etched back.

The signal through-holes 82 do not include any conductive surfaces that extend longitudinally along the axes 102 for any amount of length. As such, the signal through-holes 82 do not include any areas of low impedance and/or high cross-talk. Although the mounting contacts 74 are shown herein as press-fit contacts, the mounting contacts 74 may each be any suitable type of electrical contact that enables the mounting contacts 74 to function as described herein, such as blade type contacts or other types of contacts.

Figures 5, 6:
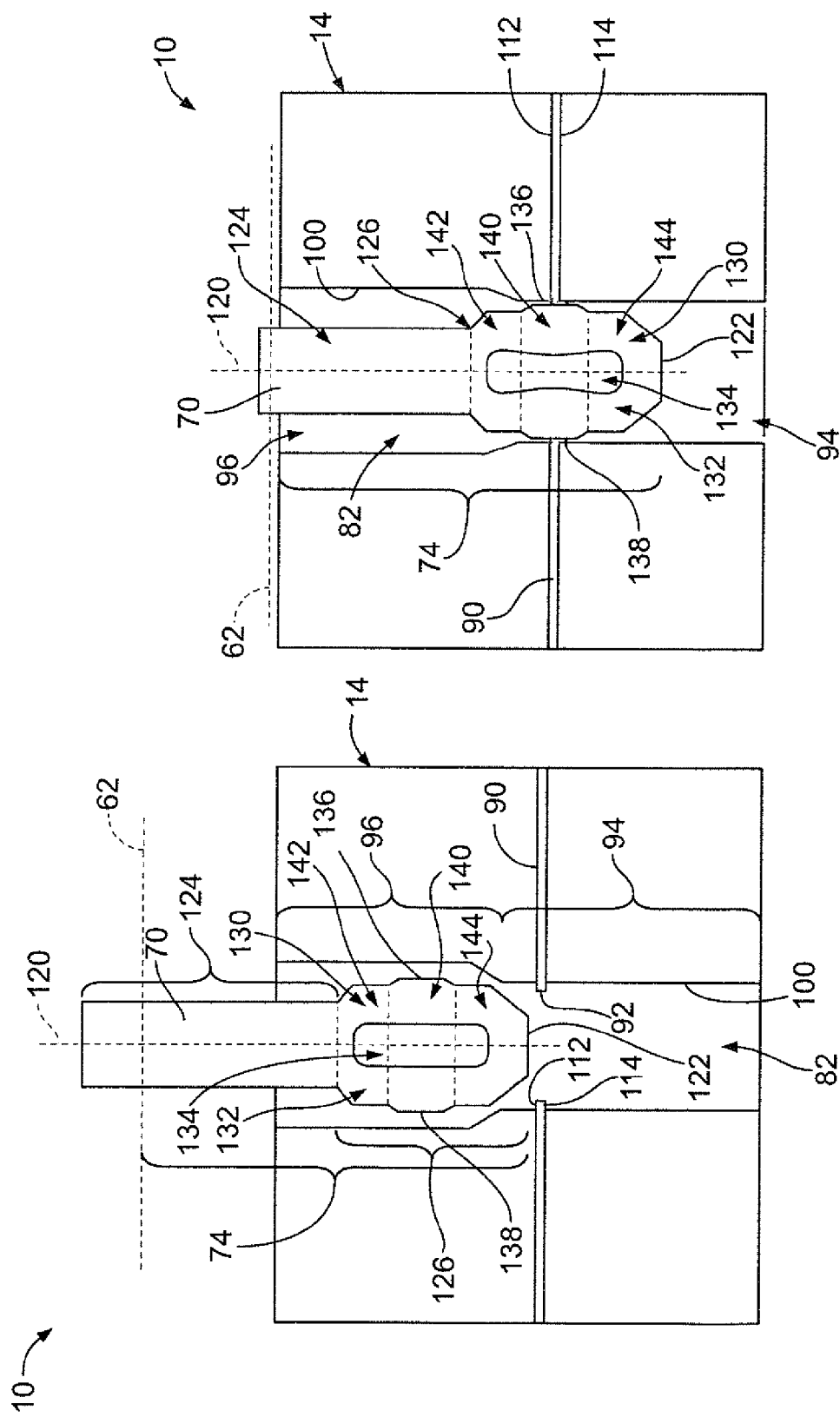
FIG. 5 illustrates a portion of the electrical connector assembly with an electrical connector in an un-loaded position within the circuit board.
FIG. 6 illustrates a portion of the electrical connector assembly with the electrical connector in a loaded position within the circuit board.

FIG. 5 illustrates a portion of the electrical connector assembly 10 showing one of the signal terminals 70 being loaded into the circuit board 14. FIG. 6 shows the signal terminal 70 in a loaded position within the circuit board 14. During assembly, when the header connector 18 (shown in FIG. 2) is coupled to the circuit board 14, the mounting contact 74 of the signal terminal 70 is loaded into the signal through-hole 82. The mounting contact 74 is configured to directly engage the signal trace 90. As shown in FIG. 5, the signal trace 90 is at least partially exposed within the signal through-hole 82. For example, the inner edge 92 as well as the upper surface 112 and lower surface 114 are exposed beyond the wall 100 of the signal through-hole 82.

The signal terminal 70 extends along a terminal axis 120. The signal terminal 70 is loaded into the signal through-hole 82 along the terminal axis 120. The portion of the signal terminal 70 that extends beyond the mounting surface 62 of the housing 60 (shown in FIG. 2) is the mounting contact 74. The mounting contact 74 extends to a tip 122. The mounting contact 74 has a neck portion 124 and a compliant portion 126 between the neck portion 124 and the tip 122. A length of the neck portion 124 may be varied to control the depth to which the signal terminal 70 extends into the signal through-hole 82.

The compliant portion 126 includes two opposing arms 130, 132. The arms 130, 132 are spaced apart to define an opening 134 therebetween. In the illustrated embodiment, the compliant section 126 constitutes an eye-of-the-needle contact. Both arms 130, 132 include interface edges 136, 138, respectively. The interface edges 136, 138 are on opposite sides of the compliant portion 126 and extend generally parallel to one another. The interface edges 136, 138 are oriented generally parallel to the terminal axis 120. The interface edges 136, 138 engage the signal trace 90 when the signal terminal 70 is loaded into the signal through-hole 82. During assembly, as the signal terminal 70 is loaded into the signal through-hole 82, the interface edges 136, 138 of the arms 130, 132 engage the exposed portion of the signal trace 90, such as the inner edge 92, the upper surface 112 and/or the lower surface 114. Engagement between the interface edges 136, 138 and the electrically conductive material of the signal trace 90 electrically connects the signal terminal 70 to the signal trace 90.

In an exemplary embodiment, the arms 130, 132 each include a stiff portion 140 and spring portions 142, 144 on opposite sides of the stiff portion 140. The stiff portion 140 has an increased width as compared to the spring portions 142, 144. The interface edges 136, 138 are defined along the outer surfaces of the stiff portions 140 of the arms 130, 132. As shown in FIG. 6, when the signal terminal 70 is loaded into the signal through-hole 82, the arms 130, 132 engage the wall 100, such as along the smaller diameter portion 94, which causes the compliant portion 126 to compress. The stiff portions 140 are pressed inward towards one another, making the opening 134 smaller. The spring portions 142, 144 are deflected inward when the stiff portions 140 are pressed inward. The interface edges 136, 138 along the stiff portions 140 remain parallel to one another. When the compliant portion 126 is compressed, the spring portions 142, 144 are angled inward.

The stiff portion 140 provides a long vertical interface at the interface edges 136, 138. The long vertical interface absorbs Y-axis tolerance between the signal terminal 70 and the signal trace 90. The long vertical interface may provide a stable interface during severe environmental circumstances, such as shock, vibration, thermal shock and the like. In an exemplary embodiment, the length of the stiff portion 140 may be approximately one-third the total length of the compliant portion 126. The length may be longer or shorter depending on the length of vertical interface desired for Y-axis tolerance. The interface edges 136, 138 provide a long vertical interface for engaging a relatively thin signal trace 90. In the illustrated embodiment, the signal trace 90 has a width along the axis of the signal through-hole 82 that is less than approximately 10% of the width of the interface edges 136, 138 along the axis of the signal through-hole 82. The parallel orientation of the interface edges 136, 138 provides a long interface area as compared to pins that have non-parallel interface edges.

Figure 7:
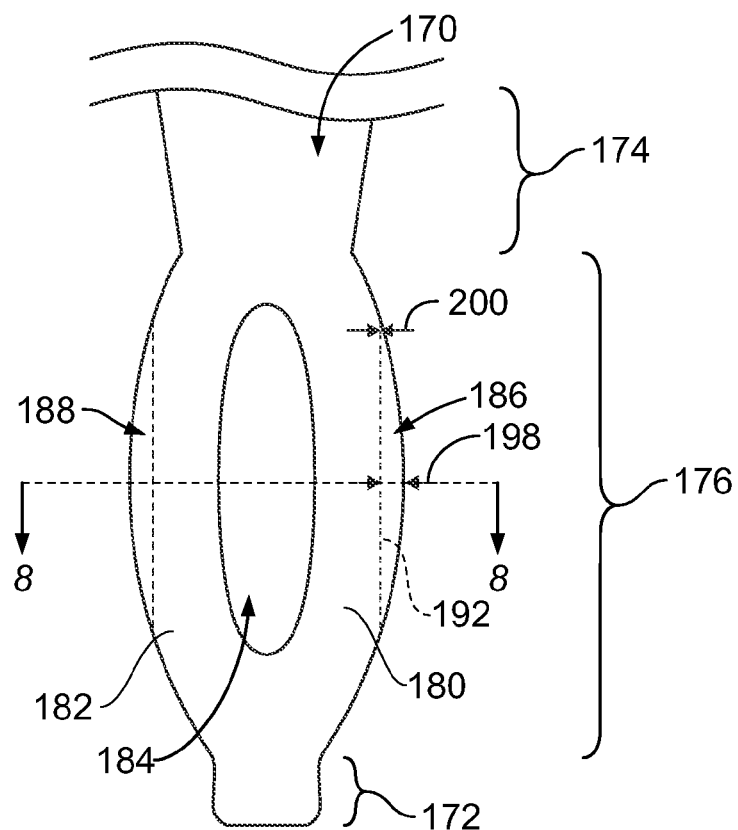
FIG. 7 is a side view of an alternative signal terminal for the electrical connector assembly.
Figure 8:
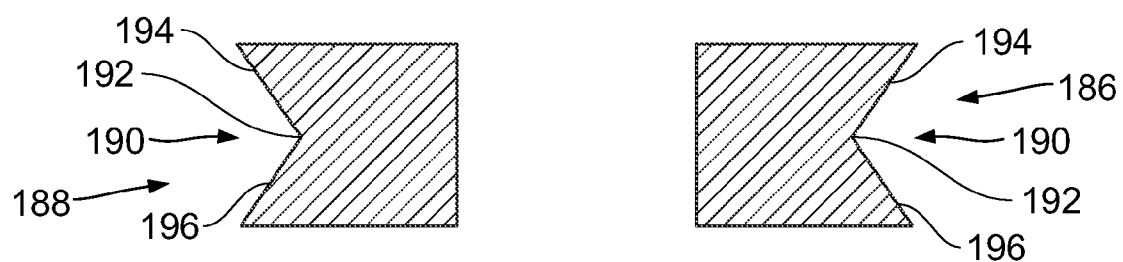
FIG. 8 is a cross-sectional view of the signal terminal shown in FIG. 7 taken along line 8-8.

FIG. 7 is a side view of an alternative signal terminal 170 for the electrical connector assembly 10. FIG. 8 is a cross-sectional view of the signal terminal 170 taken along line 8-8 shown in FIG. 7. The signal terminal 170 includes a tip section 172, a neck section 174, and a compliant section 176 between the neck section 174 and the tip section 172. The compliant section 176 includes two opposing arms 180, 182. The arms 180, 182 are spaced apart to define an opening 184 therebetween. As the signal terminal 170 is received within the corresponding signal through-hole 82 (shown in FIG. 2), the arms 180, 182 engage the wall 100 and/or signal trace 90 (both shown in FIG. 2) and are deflected inward towards each other. Engagement between the arms 180, 182 of the compliant section 176 and the electrically conductive material of the signal trace 90 electrically connects the signal terminal 170 to the signal trace 90.

The arms 180, 182 include interface edges 186, 188 along outer surfaces thereof. The interface edges 186, 188 are on opposite sides of the compliant section 176. The interface edges 186, 188 are generally parallel to one another and oriented generally parallel to the axis of the corresponding signal through-hole 82. The interface edges 186, 188 engage the corresponding signal trace 90. In an exemplary embodiment, and as shown in FIG. 8, the interface edges 186, 188 are concave along a portion thereof. For example, the interface edges 186, 188 have channels 190 formed therein. The channels 190 have a base 192 and sides 194, 196 extending outward from the base 192. The bases 192 of the channels 190 are parallel to one another.

In the illustrated embodiment, the sides 194, 196 are planar and angled with respect to one another. Alternatively, the sides 194, 196 may be curved and meet at the base 192. As shown in FIG. 7, the sides 194, 196 extend non-uniform distances from the base 192 along the compliant section 176. For example, proximate to the mid-point of the compliant section 176, the sides 194, 196 extend from the base 192 a first distance 198, which may be the maximum distance that the sides 194, 196 extend from the base 192. Proximate to the top and bottom of the base 192, the sides 194, 196 may extend a second distance 200 from the base 192. The second distance 200 may be less than the first distance 198. Optionally, the sides 194, 196 may be tapered inward until the second distance 200 is approximately zero.

When the signal terminal 170 is loaded into the signal through-hole 82, the compliant section 176 engages the corresponding signal trace 90. The arms 180, 182 may be compressed inward as the compliant section 176 is loaded into the signal through-hole 82. Optionally, the signal trace 90, which is exposed within the signal through-hole 82 may be pressed into the channel 190 such that the signal trace 90 engages the base 192 and the sides 194, 196. The base 192 and sides 194, 196 provide a large surface for engaging the exposed signal trace 90. Optionally, the sides 194, 196 may be at least partially deformed or deflected as the compliant section 176 is loaded into the signal through-hole 82. For example, the sides 194, 196 may be at least partially flattened outward to provide a greater surface area for engaging the signal trace 90. Having the bases 192 of the interface edges 186, 188 parallel to one another, defines a long vertical interface for the interface edges 186, 188 to engage the signal trace 90. The long vertical interface absorbs Y-axis tolerance and may keep a stable interface during severe environmental circumstances, such as shock, vibration, thermal shock and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A circuit board comprising:
a circuit board body having first and second surfaces, the circuit board body having through-holes extending between the first and second surfaces, the through-holes defined by walls; and
signal traces within the circuit board body, the signal traces being generally parallel to the first and second surfaces, the signal traces being exposed within corresponding through-holes, the signal traces extending at least partially into the corresponding through-holes beyond the walls;
wherein the through-holes are configured to receive signal terminals of an electrical connector such that the signal terminals engage the corresponding signal traces, the portions of the signal traces extending into the through-holes being forced against the walls by the signal terminals as the signal terminals are received in the through-holes.

2. The circuit board of claim 1, wherein the signal traces have upper surfaces, lower surfaces and inner edges, the upper surfaces, lower surfaces and inner edges being exposed within the corresponding through-holes, the lower surfaces being pressed against the walls and the upper surfaces defining mating interfaces with the signal terminals.

3. The circuit board of claim 1, wherein the through-holes are not plated, the signal traces are configured to be directly engaged by corresponding signal terminals of the electrical connector.

4. The circuit board of claim 1, wherein each signal trace defines a circumferential edge extending into the corresponding through-hole, the edge being defined by a thickness of the signal trace, the signal trace extending into the through-hole by a distance greater than the thickness of the signal trace.

5. The circuit board of claim 1, wherein each signal trace has an exposed portion exposed within the corresponding through-hole, the exposed portion being doughnut shaped having a radially inner surface and a radially outer surface at the wall of the corresponding through-hole.

6. The circuit board of claim 1, wherein the portion of the wall adjacent the signal trace has a first diameter, and wherein the signal trace has a second diameter smaller than the first diameter.

7. The circuit board of claim 1, wherein the through-holes are bored through circuit board body and then the circuit board body is etched to remove a layer of the circuit board body along the bored through-hole, the signal traces being exposed when the circuit board body is etched away, the circuit board body being etched away by a significant amount to expose upper surfaces of the signal traces having widths that are greater than thicknesses of the signal traces.

8. An electrical connector assembly comprising:
a circuit board comprising a circuit board body having first and second surfaces, the circuit board body having through-holes bored between the first and second surfaces, the through-holes defined by walls, the circuit board having signal traces on internal layers of the circuit board, the signal traces being generally parallel to the first and second surfaces, portions of the circuit board body within the through-holes being etched away to expose portions of the signal traces beyond the circuit board body within the corresponding through-hole, the exposed portions of the signal traces having widths that are greater than thicknesses of the signal traces; and
an electrical connector mounted on the circuit board, the electrical connector comprising a housing and signal terminals held by the housing, the signal terminals received in respective through-holes of the circuit board and engaging the corresponding signal traces, the portions of the signal traces extending into the through-holes being forced against the walls by the signal terminals as the signal terminals are received in the through-holes.

9. The electrical connector assembly of claim 8, wherein the signal traces have upper surfaces, lower surfaces and inner edges exposed within the corresponding through-holes, the lower surfaces being pressed against the walls and the upper surfaces defining mating interfaces with the signal terminals.

10. The electrical connector assembly of claim 8, wherein the through-holes are not plated, the signal traces are configured to be directly engaged by corresponding signal terminals of the electrical connector.

11. The electrical connector assembly of claim 8, wherein the portion of the wall adjacent the signal trace has a first diameter, and wherein the signal trace has a second diameter smaller than the first diameter.

12. The electrical connector assembly of claim 8, wherein the signal terminals include compliant pins having an eye-of-the-needle type compliant section, the compliant section pressing against the corresponding signal trace to make electrical contact with the signal trace.

13. The electrical connector assembly of claim 8, wherein the signal terminals constitute variable depth signal terminals being configured to extend different depths into respective through-holes of the circuit board, the signal terminal being arranged in pairs carrying differential pair signals, the signal terminal of each pair extending to the same depth in the respective through-holes of the circuit board.

14. The electrical connector assembly of claim 8, wherein the signal terminals have compliant pins received in respective through-holes of the circuit board, the compliant pins having a compliant section including opposite, parallel interface edges oriented parallel to an axis of the corresponding through-hole, the interface edges engaging the corresponding signal trace.

15. The electrical connector assembly of claim 8, wherein the signal terminals have compliant pins received in respective through-holes of the circuit board, the compliant pins having a compliant section including opposite interface edges, the interface edges being concave along a portion thereof, the interface edges engaging the corresponding signal traces.

16. The electrical connector assembly of claim 8, wherein the signal terminals have compliant pins received in respective through-holes of the circuit board, the compliant pins having a compliant section including opposite interface edges, the interface edges having channels formed therein, the channels having a base and sides extending outward from the base, the bases of the channels being parallel to one another, the sides extending non-uniform distances from the base along the compliant section, the interface edges engaging the corresponding signal traces.

17. An electrical connector assembly comprising:
a circuit board having first and second surfaces, the circuit board having through-holes extending along axes between the first and second surfaces, the through-holes defined by walls, the circuit board having signal traces within the circuit board being generally parallel to the first and second surfaces, the signal traces being exposed within corresponding through-holes; and
an electrical connector mounted on the circuit board, the electrical connector comprising a housing and signal terminals held by the housing, the signal terminals having compliant pins received in respective through-holes of the circuit board, the compliant pins having a compliant section including opposite, parallel interface edges oriented parallel to the axes of the through-holes, the interface edges engaging the corresponding signal traces;

wherein the compliant sections include arms extending along an opening, the arms each having a stiff portion bounded by spring portions, the stiff portions being compressed inward toward one another when loaded into the through-hole, the stiff portions defining the interface edges, which remain parallel when the stiff portions are compressed, the spring portions being deflected when the stiff portions are compressed; and wherein the portions of the signal traces extending into the through-holes are forced against the walls by the signal terminals as the signal terminals are received in the through-holes.

18. The electrical connector assembly of claim 17, wherein the signal traces have upper surfaces, lower surfaces and inner edges exposed within the corresponding through-holes, the lower surfaces being pressed against the walls and the upper surfaces defining mating interfaces with the signal terminals.

19. The electrical connector assembly of claim 17, wherein the through-holes are bored through the circuit board and then the circuit board is etched to remove a layer of the circuit board along the bored through-hole, the signal traces being exposed when the circuit board is etched away, the circuit board being etched away by a significant amount to expose upper surfaces of the signal traces having widths that are greater than thicknesses of the signal traces.

20. The electrical connector assembly of claim 17, wherein each signal trace defines a circumferential edge extending into the corresponding through-hole, the edge being defined by a thickness of the signal trace, the signal trace extending into the through-hole by a distance greater than the thickness of the signal trace.

* * * * *